United States Patent [19]
Jennings

[11] Patent Number: 6,096,621
[45] Date of Patent: Aug. 1, 2000

[54] POLYSILICON FILLED TRENCH ISOLATION STRUCTURE FOR SOI INTEGRATED CIRCUITS

[75] Inventor: Dean Jennings, San Ramon, Calif.

[73] Assignee: Elantec, Inc., Milpitas, Calif.

[21] Appl. No.: 08/841,493

[22] Filed: Apr. 23, 1997

[51] Int. Cl.[7] .................................................. H01L 21/76
[52] U.S. Cl. .......................................... 438/404; 438/406
[58] Field of Search .................................... 438/219, 295, 438/355, 404, 405, 637, FOR 222, FOR 346, FOR 363, FOR 105, 406

[56] References Cited

U.S. PATENT DOCUMENTS

| | | |
|---|---|---|
| 4,638,552 | 1/1987 | Shimbo et al. . |
| 4,968,628 | 11/1990 | Delgado et al. . |
| 5,270,265 | 12/1993 | Hemmenway et al. . |
| 5,445,988 | 8/1995 | Schwalke . |
| 5,569,621 | 10/1996 | Yallup et al. . |

*Primary Examiner*—George Fourson
*Attorney, Agent, or Firm*—Fliesler, Dubb, Meyer & Lovejoy LLP

[57] ABSTRACT

A method for dissipating accumulated charge in a trench isolation structure, comprising the steps of: etching the trench region into a silicon substrate; forming an insulating region on the sidewalls of the trench and the base of the trench; removing the insulator at the bottom of the trench; and filling the trench with polysilicon, the polysilicon engaging the second layer of silicon below the insulator layer.

10 Claims, 4 Drawing Sheets

POLYSILICON FILLED TRENCH ISOLATION STRUCTURE FOR SOI INTEGRATED CIRCUITS

BACKGROUND OF THE INVENTION

1. Field of the Invention

The invention relates to insulation structures, and particularly to improving the characteristics of trench isolation structures in which polysilicon is used as a trench fill material.

2. Description of the Related Art

A typical integrated circuit, manufactured on a silicor substrate, comprises a series of active devices formed in and on the silicon substrate. Each active device is formed by introducing impurities into a surface of the substrate, generally through the use of implantation or diffusion of the impurity, to vary the conductivity of different regions of the substrate. This requires a series of processing steps which includes masking selected portions of the wafer to place the impurities at selected locations on the wafer. A substrate will generally have a first conductivity type, with the impurities selected to form regions in the substrate of opposite conductivity type or to enhance conductivity of the substrate. The active devices are electrically isolated from other active devices through the use of various electrical isolation schemes.

In forming some types of integrated circuits, particularly bipolar devices, it is desirable to provide layers of impurity which are "buried" below the surface of the substrate. Traditionally, a buried layer was formed by diffusion of a selected impurity in a layer of epitaxial silicon which was provided on the surface of a single crystal substrate and into which the active devices were formed.

While several processing techniques are conventionally available to achieve such buried regions, advances in wafer processing technology have increased the popularity of so-called "bonded" wafers.

In bonded wafer technology, two single-crystal substrates are joined so that impurities can be introduced into a first surface of a first wafer to form an impurity region which subsequently becomes a buried region when the first wafer is bonded to a second or "handle" wafer at the first surface. In general, the handle wafer is comprised of a semiconductor having a first conductivity type, such as a p-type impurity, while the first substrate is comprised of a second conductivity type, such as an n-type impurity.

The handle wafer is "bonded" to the first substrate through any number of techniques. In bonding the wafers, Van der Waals forces may suffice in some cases (where tolerances are exacting, as disclosed in U.S. Pat. No. 4,638, 552) or a thin oxide layer may be formed between adjacent surfaces (such as in U.S. Pat. No. 4,968,628). Where a thin oxide is formed, the substrates are heated to ensure bonding of the substrates to each other. This latter process is illustrated in FIGS. 1–4.

FIGS. 1–4 are cross sections generally showing the procedure for manufacturing an active device having a buried layer using a bonded wafer technique and junction isolation. Each of the active devices in an integrated circuit must be electrically isolated from the adjoining active region to prevent cross-over electrical effects between adjoining devices which would defeat overall operation of the circuit. The devices are thereafter connected to a series of metal or metal-alloy interconnect structures to complete the integrated circuit device.

FIG. 1 shows a p-type silicon substrate 10. Substrate 10 will have formed therein, for example, a n+ type region 12 by implantation or diffusion. Region 12 will become a buried layer formed in substrate 10 by selected diffusion. The surface of substrate 10 must be polished to a high tolerance surface finish, such as by chemical mechanical polishing, and may have a thin oxide layer formed thereon such as shown in FIG. 2. Oxide layer 14 is formed on the surface of substrate 10.

As shown in FIG. 3, a handle wafer 15 is thereafter bonded to substrate 10. Handle wafer 15 is generally an n-type substrate and will also have a thin layer of oxide formed on the surface to be bonded, such surface also being polished to a high degree of smoothness. The oxide on the handle wafer will contact oxide layer 14 on the surface of substrate 10. The wafers may then be heated to a temperature of about 1,000° C. and held there for a period of time of about one hour. This causes the oxide layers to bond, thereby joining wafers 10 and 15. The resulting combined oxide layers 14' define the desired dielectric isolation thickness. After additional grind and polish steps, further processing can then occur on the backside 16 of substrate 10. Note that n+ region 12 becomes a buried region within the completed assembly.

As shown in FIG. 4, a p well 19 will be formed in substrate 10, and n+ emitter and collector contacts 17,18, and n+ base contact 20 may be formed to complete a bipolar transistor.

While additional p+ regions 11 may be provided to serve as reverse biased PN junction lateral device isolation, the degree of isolation afforded by junction isolation is limited by collector-substrate leakage currents and collector-substrate capacitance. Several alternative isolation techniques have developed to prevent leakage currents from impeding device performance, including dielectric isolation and trench isolation. Dielectric isolation typically comprises etching pockets in a wafer surface, oxidizing the pockets, and backfilling the pockets with polysilicon. The wafer may then be turned over, ground and polished until the original oxide layer is reached, leaving oxide isolated pockets of the original silicon material in which active devices may be formed.

Trench isolation involves etching a trench into the substrate, and filling the trench with an insulation material. Trench isolation is relatively complex because an anisotropic etch must be used to define the trench, the trench must be etched deeply into the silicon, and filling the trench with the isolation material can give rise to additional processing issues in preparing the integrated circuit. After the trench is formed in the substrate wafer, a layer of insulating material such as silicon dioxide is deposited over the surface of the wafer and into the trench by a conformal deposition process, such as TEOS oxide. While silicon dioxide can fill the trench completely, this can create a great deal of stress in the substrate. Thus, the conformal layer of TEOS oxide will generally be deposited in a quantity sufficient to provide the requisite isolation, but not completely fill the trench. The remaining portion of the trench will be filled with polysilicon which has nearly identical thermal characteristics to bulk silicon, thus reducing stress in the substrate.

This process is illustrated in FIGS. 5–7. FIG. 5 shows a cross section of a bonded wafer structure. As shown in FIG. 5, a trench 29 is anisotropically etched into the substrate 10. The etch is made using a directional etch process, such as planar plasma etching, ion beam etching or reactive ion etching, with an oxide barrier layer 34a patterned to expose the trench region to be etched. The silicon substrate 10 in the trench region is etched down to oxide layer 14'. Thereafter, an oxide layer 34b is deposited on the second surface 13₂ (the field oxide which remains after trench etch) of substrate 10 through use of a TEOS or other conformal oxide process. As shown in FIG. 6, oxide 34b covers the sidewalls 21, 22 of trench 29. Surface 13₂ is covered with the composite of any portion of oxide layer 34a left after trench etch plus 34b. The TEOS oxide process, for example, is a conformal deposition process and results in a relatively uniform oxide thickness in the range of 2–4 K Å on the bottom and sidewalls of trench 29, as well as the surface 13₂ of the wafer. The remaining volume of trench 29 is filled with polysilicon 35 and the portion of oxide 34 on the surface 13₂ of substrate 10 is thereafter removed by etch back or chemical mechanical polishing (CMP). As shown in FIG. 7, polysilicon 35 is thus electrically isolated from the remaining portions of silicon substrate 10.

Oxide layer 34b will be deposited to a thickness which is sufficient to provide the requisite isolation which is required based upon the particular active devices being formed. Polysilicon 35 is deposited in a trench as the preferred means of filling the remaining void, since polysilicon is thermally matched to the silicon comprising substrate 10. Thus, less stress will occur in the wafer with polysilicon in the trench during subsequent processing than were oxide used as the sole trench fill material. As a result of its electrical isolation, polysilicon 35 can act as a charge capacitor and, in certain circumstances, an inversion region 41 is induced in the silicon adjacent to oxide 34 and between two separate p+ diffused regions 27,28, as shown in FIG. 8. Diffused p+ regions 27,28 may comprise, for example, the emitter and collector of a PNP bipolar transistor. The inversion region 41 in the device silicon forms a conductive path between regions 27,28, shorting the circuit.

Thus, the integrity of the active device in a given active region can be compromised.

One method previously used to cure this problem was to provide polysilicon "tabs" which allow coupling of the polysilicon to a charge dissipation mechanism. Provision of such tabs requires a separate masking and polysilicon deposition step to ensure the contacts are large enough to enclose a normal-sized contact.

SUMMARY OF THE INVENTION

The invention comprises a method and means for removing the charge from and controlling the potential of the isolating regions of a semiconductor device by providing a contact structure which couples the polysilicon or other charge retaining material in an isolation region to a charge dissipation means.

In one aspect, the method is useful in a silicon-on-insulator integrated circuit having a plurality of active devices formed therein with a trench isolation structure comprised of an insulating material and polysilicon to laterally isolate the active devices. The method comprises the steps of: etching the trench region into the first layer of silicon and through the buried insulator layer; passivating the sidewalls with a conformal oxide; and filling the trench with polysilicon, the polysilicon engaging the second layer of silicon below the insulator layer.

In a further aspect, the method comprises: forming a trench in the silicon, the silicon having a surface and the trench extending to a depth below the surface equal to the thickness of the first layer of silicon, the trench having a width; forming a second insulator layer in the trench and on the surface of the first layer of silicon; forming a field oxide over the surface of the silicon, the oxide and the polysilicon; removing a portion of the field oxide, said portion overlying the trench width; etching the field oxide, the second insulator layer in the trench, and the insulator; and forming a layer of polysilicon on the insulator layer in the trench; forming a conductive material on the surface of a portion of the field oxide and on the surface of the polysilicon.

In yet another aspect, the invention comprises an apparatus comprising: a first substrate having a top surface and a bottom surface; a second substrate bonded to the bottom surface of the first substrate; a first isolation layer between the first and second substrates; a trench, having a trench width and a depth extending throughout the first substrate and the isolation layer, in the first substrate; a second isolation layer in the trench; a semiconductor layer over the isolation layer in the trench and extending into contact with the second substrate; and a field oxide layer overlying the semiconductor layer, a portion of the isolation layer, and the top surface of the first substrate.

BRIEF DESCRIPTION OF THE DRAWINGS

The invention will be described with respect to the particular embodiments thereof. Other objects, features, and advantages of the invention will become apparent with reference to the specification and drawings in which.

DESCRIPTION OF THE PREFERRED EMBODIMENTS

The invention provides an improved insulation structure by providing an electrical contact to the isolation structure, allowing control of the conductive nature of the isolation structure.

In the following description, numerous details, for example, specific materials, process steps, etc., are set forth in order to provide a thorough understanding of the present invention. It will be obvious, however, to one skilled in the art that the specific details need not be employed to practice the present invention.

FIGS. 9–12 illustrate the process of the present invention which provides improved contact to a trench isolation region which is filled with polysilicon or other conductive material which is formed on a silicon on insulator integrated circuit coupled to the silicon below the insulator layer in a conventional silicon on insulator structure.

Figure 9:
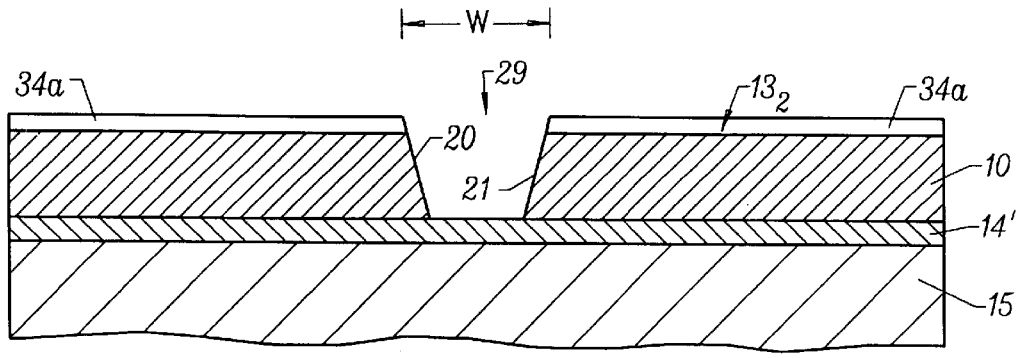
FIGS. 9–12 illustrate formation of a trench isolation region in an SOI substrate in accordance with the present invention.
Figure 10:
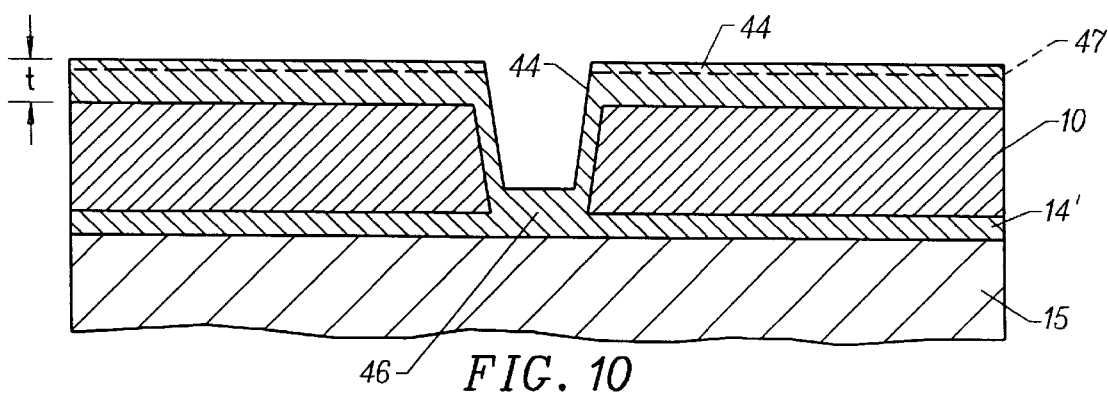

As shown in FIG. 9, trench 29 is formed by an anisotropic etch process by applying a mask layer of oxide 34a, etching the oxide 34a, and etching silicon substrate 10 down to oxide layer 14' using a selective silicon etch process. Trench 29 is formed to width W which is limited in a practical sense by the formative limits of the photolithographic technology used to manufacture the integrated circuit. It should be understood that advances in photolithography technology reducing the minimum fabrication dimension available are contemplated by the invention. Currently, a typical fabrication dimension that may be formed on an analog integrated circuit is approximately 2 microns.

A key feature of the present invention is the improvement in the isolation afforded by an isolation structure filled with polysilicon by electrically coupling the polysilicon to a charge control mechanism.

Figure 1:
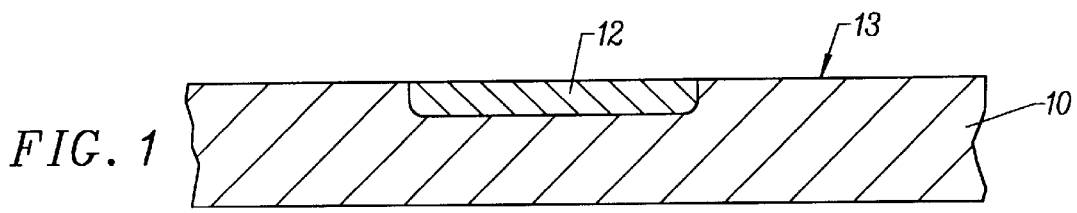
FIGS. 1–4 are cross sections of a silicon wafer illustrating the process for forming a bonded wafer integrated circuit assembly.
Figure 2:
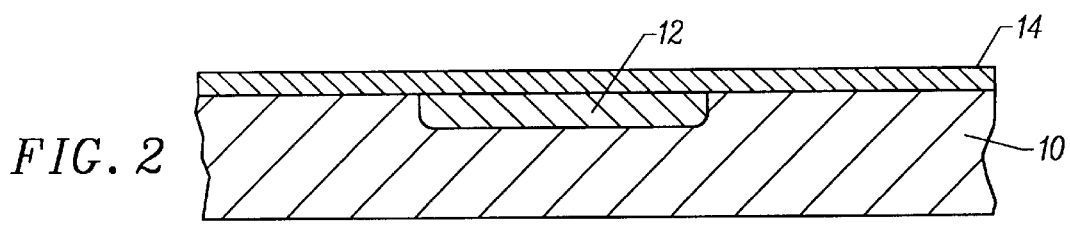
Figure 3:
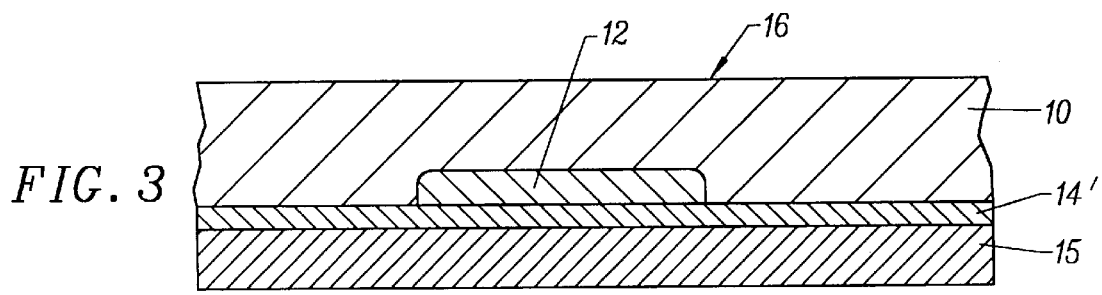
Figure 4:
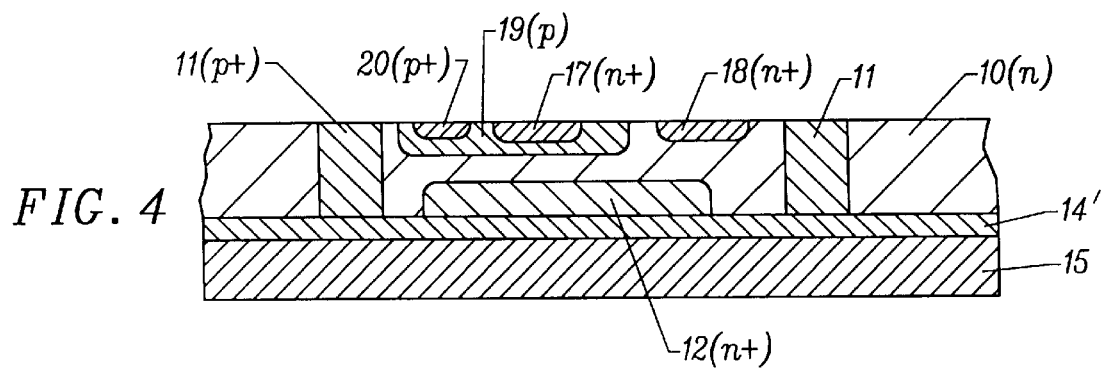
Figure 8:
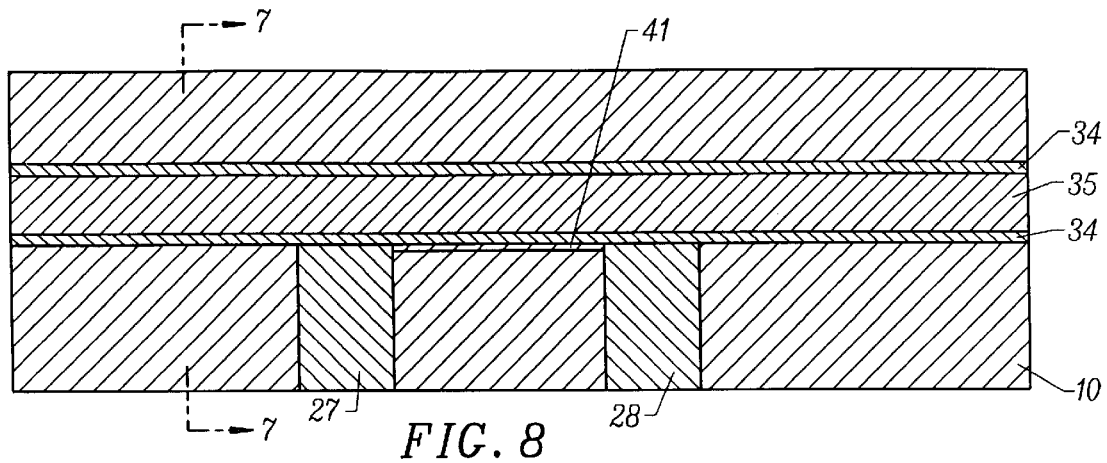
FIG. 8 is a top view of a first portion of a silicon wafer having a trench isolation structure and active regions formed therein.
Figure 5:
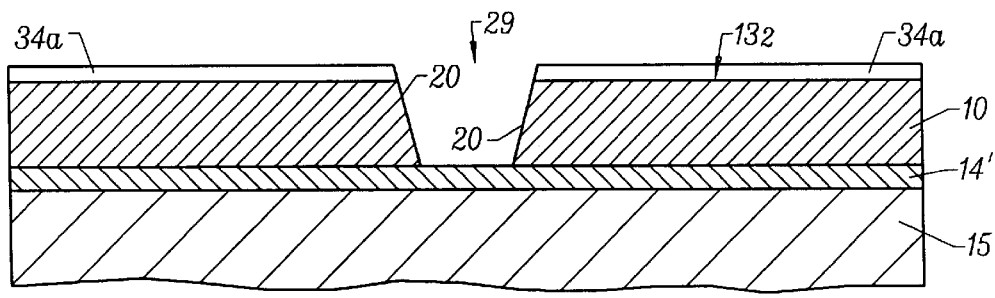
FIGS. 5–7 are cross sections of a bonded wafer illustrating formation of a trench isolation region in the bonded wafer assembly.
Figure 6:
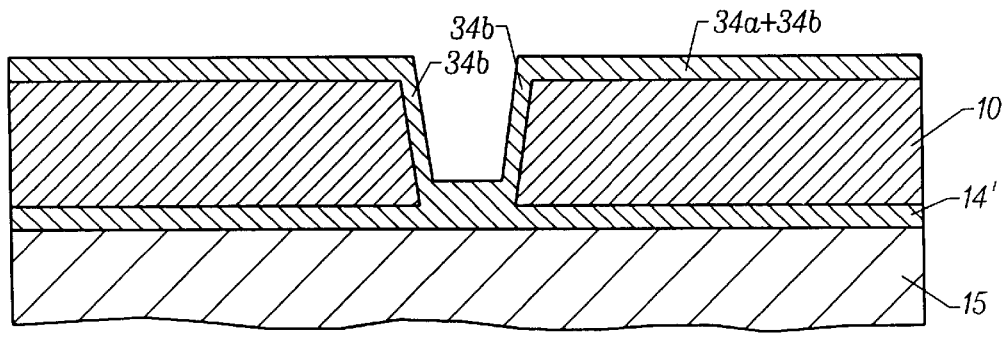
Figure 7:
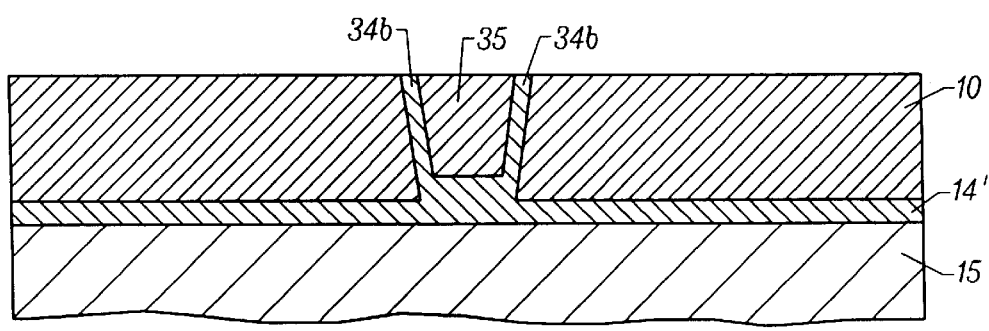

In the conventional formation of a trench isolation structure, a conformal deposition layer of oxide 44 is deposited on the surface $13_2$ of wafer 10 and into trench 29. This conformal oxide may be formed by a TEOS or other conformal oxide process. In accordance with the invention, the total thickness T of the field oxide on surface $13_2$ of wafer 10 should be greater than the thickness of the combined oxides in region 46 at the base of trench 29. Note that the dashed line 47 in FIG. 6 indicates that the thickness of the deposited, conformal layer used in conjunction with oxide 34a would reach line 47, and that the two oxides combine to form a total oxide thickness of the insulator layer. Application of the conformal oxide 44 will also fill at least a portion of trench region 29 to create lateral isolation on walls 21,22 of trench 29, and on the surface of layer 14' in trench 29. Application of the conformal layer on surface $13_2$ with in conjunction with thermal oxide 34a is less stressful on the substrate. Thus, the total thickness of insulator at the base 46 of the trench 29 will be equivalent to the amount of oxide which reaches the base of trench 29 plus the insulator layer 14'.

Figure 11:
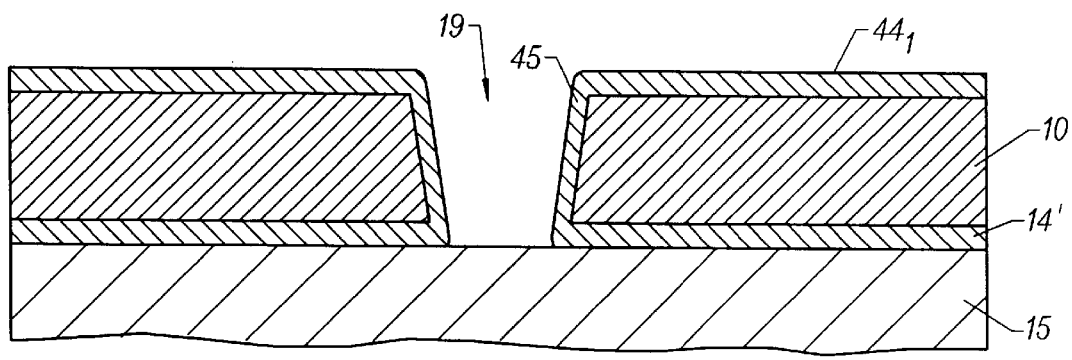
Figure 12:
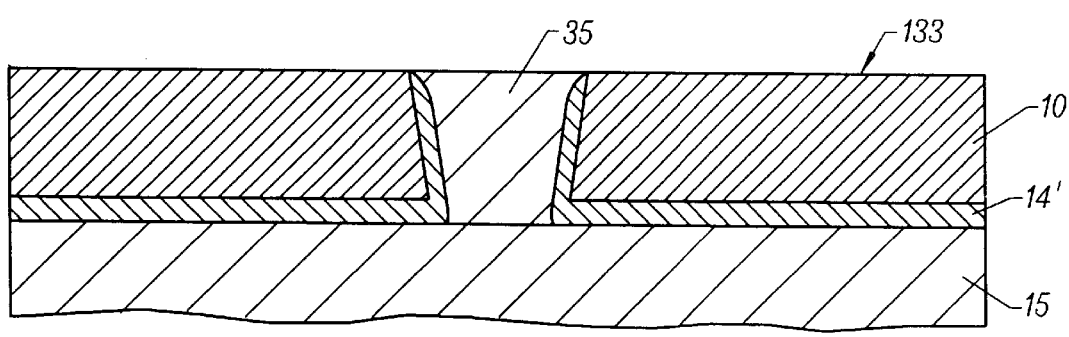
Figure 13:
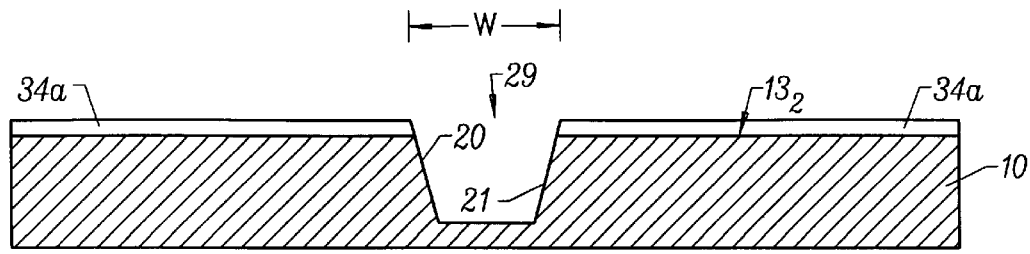
FIGS. 13–16 illustrate formation of a trench isolation region in a bulk substrate in accordance with the present invention.
Figure 14:
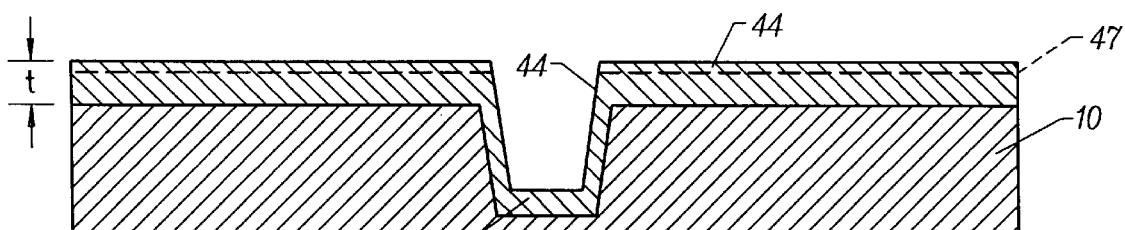
Figure 15:
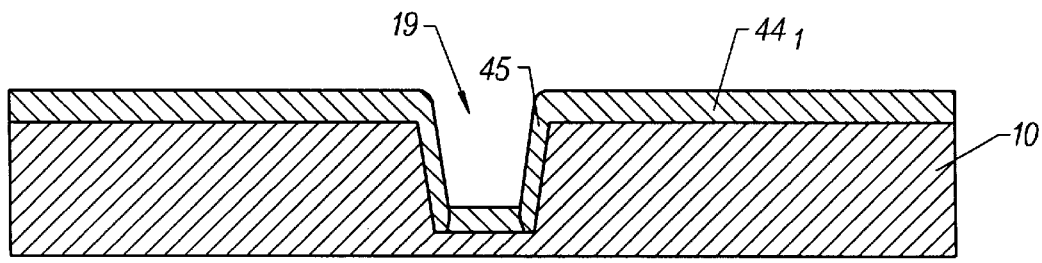
Figure 16:
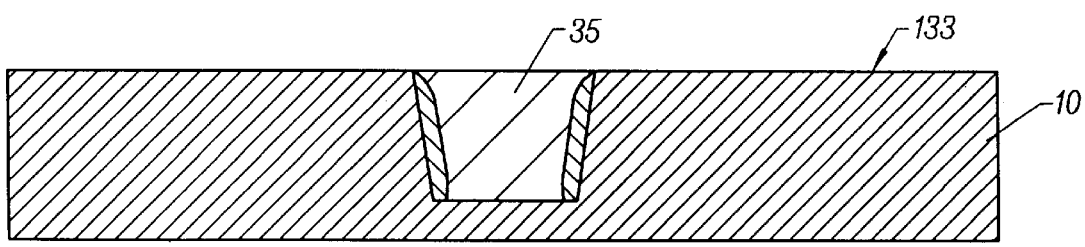

In accordance with the invention, as shown in FIG. 11, an etch process, such as reactive ion etching, is thereafter used to remove the oxide in region 46 to expose silicon wafer 15. The reactive ion etch will create spacers 45 which provide lateral isolation of adjacent active regions, the spacers being similar to those conventionally seen in CMOS technology. Depending upon the thickness of layer 44, a portion $44_1$ of the field oxide layer may remain after the reactive ion etch. As shown in FIG. 12, the trench 19 is subsequently filled with polysilicon or other suitable material, and the oxide $44_1$ optically polished so that a smooth surface $13_3$ remains to allow for further processing on the structure. As shown in FIG. 12, polysilicon or other material is then provided in trench 29 and is in conductive contact with silicon 15 of the underlying wafer. Thus, any charge which would normally collect due to the isolation of polysilicon in the trench can be easily dissipated by conductive contact through wafer 15.

As should be readily recognized, alternatives exist to the formation of oxide 44 including the use of thermal oxide, but oxide 44 must have a thickness on surface $13_2$ which is equal to or exceeds the thickness of the oxide in region 46. Oxide 44 may be a conformal layer of TEOS oxide coupled with a thermally grown layer, or a thermally grown layer with a secondary deposit of TEOS oxide. In one embodiment, insulator layer 14' has a thickness of approximately 1.0 micron, but can be in the range of 0.5 to 1 micron. Oxide layer 44 can be in the range of 2,000 Å to 1.0 micron, and one embodiment is in the range of about 0.5 micron.

As a result, the isolation structure of the present invention ensures that the polysilicon deposited in the trench isolation structure will not charge up and affect the active devices formed in substrate 10. As should be noted, the particular contact structure will have broader applications in devices where trench isolation structures utilizing polysilicon fills are implemented, including silicon on insulator (SOI) technologies. The contact structure of the present invention is particularly useful in bonded wafer technology where the polysilicon is isolated from the balance of the device.

FIGS. 13–16 parallel FIGS. 9–12, respectively, and illustrate the process described with respect to FIGS. 9–12 in a bulk substrate.

The many objects, advantages and variations of the present invention will be obvious to one of average skill in the art. It should be recognized that all such variations and advantages are intended to be within the scope of the invention as defined by the instant specification and the following claims.

What is claimed is:

1. A method of forming an isolation structure in a silicon on insulator integrated circuit device including a first layer of silicon having a thickness, an insulator and a second layer of silicon, comprising:

forming a trench in the silicon, the silicon having a surface with an oxide layer and the trench extending to a depth below the surface equal to the thickness of the first layer of silicon, the trench having a width;

forming a second insulator layer in the trench and on the surface of the first layer of silicon;

etching the oxide, and the insulator layer at the bottom of the trench; and forming a layer of polysilicon on the insulator layer in the trench; and forming a conductive material on the surface of a portion of the insulator layer and on the surface of the polysilicon.

2. The method of claim 1 wherein the insulator layer on the first layer of silicon has a thickness equal to or greater than the thickness of the oxide layer at the bottom of the trench.

3. The method of claim 1 wherein the step of forming comprises anisotropically etching a trench into the silicon.

4. The method of claim 1 wherein the step of forming an insulator layer in the trench comprises depositing a TEOS oxide on the silicon and in the trench.

5. The method of claim 4 wherein the step of depositing comprises depositing a TEOS oxide through a plasma enhanced chemical vapor deposition process.

6. A method comprising:

(a) providing a first substrate of a first conductivity type having a top surface and a bottom surface;

(b) providing a second substrate of a second conductivity type having a top surface and a bottom surface;

(c) bonding the first substrate to the second substrate with a buried oxide layer between the first and second substrates;

(d) thinning the first substrate by grind and polish;

(e) providing a field oxide layer on the surface of the first wafer;

(f) forming a trench in the first wafer, the trench having a depth extending to the buried oxide layer thereby exposing a portion of the buried oxide layer, and a width;

(g) forming an insulating layer in the trench, the insulating layer lining the walls of the trench, said portion of said buried oxide layer, and field oxide layer;

(h) etching the field oxide layer, the insulating layer on said portion of said buried oxide layer, and said portion of said buried oxide layer thereby exposing said portion of said second substrate;

(i) filling said trench with polysilicon; and (j) coupling the polysilicon to a charge coupling mechanism.

7. The method of claim 6 further including the steps, prior to step (b) of forming a first impurity region in the first substrate, the first impurity region being of the second impurity type.

8. The method of claim 7 wherein said step of forming comprises implanting an impurity in the top surface of the first wafer.

9. The method of claim 7 wherein said step of forming comprises diffusing an impurity in the top surface of the first wafer.

10. The method of claim 6 wherein said step of bonding comprises placing the top surface of the first substrate adjacent to the top surface of the second substrate; and heating the first and second substrates.

* * * * *